(12) United States Patent
Copner et al.

(10) Patent No.: US 6,345,060 B1
(45) Date of Patent: Feb. 5, 2002

(54) FREQUENCY STABILIZED SEMICONDUCTOR LASER

(75) Inventors: Nigel J Copner, Ottowa (CA); Raymond J Chaney, Berkeley (GB)

(73) Assignee: Renishaw PLC, Gloucestershire (GB)

( * ) Notice: Subject to any disclaimer, the term of this patent is extended or adjusted under 35 U.S.C. 154(b) by 0 days.

(21) Appl. No.: 09/254,709

(22) PCT Filed: Jul. 17, 1998

(86) PCT No.: PCT/GB98/02141

§ 371 Date: May 5, 1999

§ 102(e) Date: May 5, 1999

(87) PCT Pub. No.: WO99/04466

PCT Pub. Date: Jan. 28, 1999

(30) Foreign Application Priority Data

Jul. 18, 1997 (GB) .............................. 9715022

(51) Int. Cl.[7] .............................. H01S 3/13; H01S 5/00
(52) U.S. Cl. .................... 372/32; 372/29.01; 372/29.02
(58) Field of Search .................... 372/43, 32, 29.01, 372/29.02

(56) References Cited

U.S. PATENT DOCUMENTS 3,588,738 A * 6/1971 Goodwin .................... 372/32
4,547,664 A 10/1985 Vogt et al.
5,825,792 A 10/1998 Villeneuve et al.
5,896,201 A * 4/1999 Fukushima ................. 356/394

FOREIGN PATENT DOCUMENTS

| DE | 44 29 748 A1 | 3/1995 |
|---|---|---|
| EP | 0 091 068 A1 | 10/1983 |
| EP | 0 516 318 A2 | 12/1992 |
| EP | 0 818 859 A1 | 1/1998 |
| JP | A-58-97882 | 6/1983 |
| JP | A-63-41093 | 2/1988 |

* cited by examiner

Primary Examiner—James W. Davie
Assistant Examiner—James Menefee
(74) Attorney, Agent, or Firm—Oliff & Berridge PLC

(57) ABSTRACT

The output frequency of a semiconductor laser beam is stabilized using a grating or another optical device which has an interaction with the beam whose parameters are sensitive to the beam frequency. The grating (130) generates positive and negative first order diffracted beams (132, 134), whose angle of diffraction is sensitive to the beam frequency, and is detected by split photodetectors AB, CD respectively. In the event of a change in beam frequency the outputs from the photodetectors AB, CD will vary to provide an error signal for the laser frequency. This error signal is insensitive to variations in angular alignment between the beam and the diffraction grating. This is because variations in frequency and variations in angular alignment cause different changes in the outputs of the photodetectors AB, CD.

27 Claims, 4 Drawing Sheets

FREQUENCY STABILIZED SEMICONDUCTOR LASER

The present invention relates to a frequency stabilised semi-conductor laser, which may be used in an interferometer system, for example, to measure displacement.

It is known to stabilise the frequency of such a laser by directing the output beam of the laser onto an optical component which interacts with the beam. A parameter describing the interaction, and which is dependent upon the frequency of the incoming beam is monitored to provide an error signal that may be used to stabilise the diode frequency. One example of the use of this technique employs a Fabry-Perot interferometer, or etalon. The intensity of the beam transmitted through the etalon depends upon the frequency of the incoming beam, and thus monitoring this parameter provides a suitable error signal. In a further example the laser beam is directed at an angle onto a reflective grating. The angle at which one of the resultant beams is reflected and diffracted from the grating is monitored (since this parameter is dependent upon the frequency of the incident beam) to provide an error signal.

A problem with such a method of stabilisation is that the parameters of interaction which are sensitive to frequency are also dependent, inter alia, upon the angular orientation of the optical device with respect to the incoming beam. A shift in relative angular displacement of the beam and device will therefore also alter the error signal, even if no shift in frequency has occurred. One aspect of the present invention seeks to overcome this problem by providing an apparatus for stabilising the output frequency of a semi-conductor laser comprising: an optical device situated in the laser beam path, and which interacts with the beam, wherein a parameter describing the interaction varies with (a) incident beam frequency, and (b) angle of incidence between the incident beam and the device; means for producing from the incident beam at least two non-parallel beams each of which is incident upon at least one optical detector, the outputs of the detectors being processed to produce an error signal for controlling operation of the laser in order to stabilise its output frequency, the error signal being sensitive to changes in frequency, and insensitive to changes in angle of incidence.

The optical device may, for example, be an etalon, a grating or an absorption cell, or any other device sensitive to frequency and incident angle.

Embodiments of the invention will now be described, by way of example, and with reference to the accompanying drawings in which.

Figure 1:
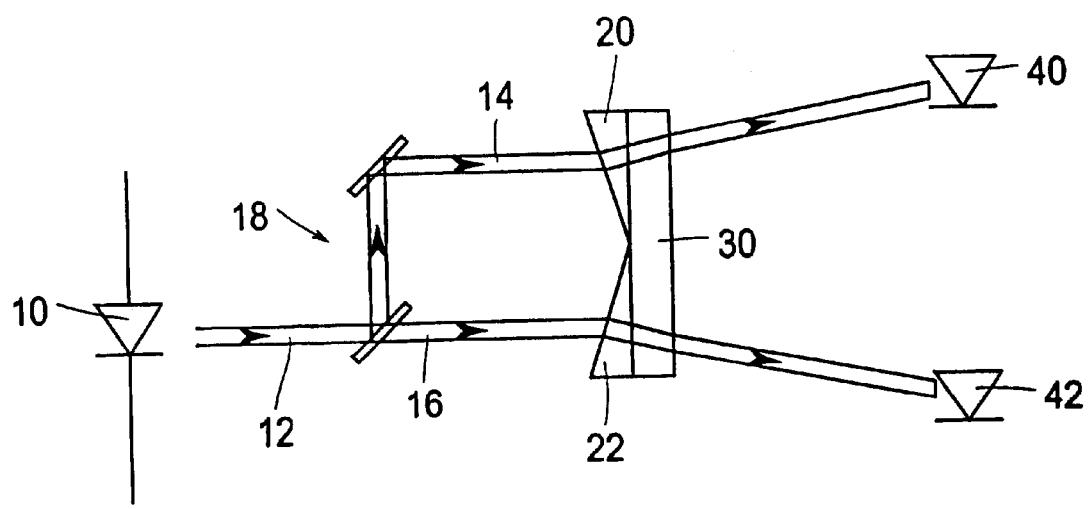
FIG. 1 is a schematic illustration of a frequency stabilised laser diode in accordance with the present invention.

Referring now to FIG. 1, a laser diode 10 emits a beam 12 of laser light, which is split into a pair 14,16 of mutually parallel beams by a periscope 18. The beams 14,16 are incident upon prism elements 20,22, arranged to have the same refractive effect as a crude two-dimensional concave lens i.e. the beams are divergent (prisms causing convergence may also be used). Upon passage through the prism elements 20,22 the beams 14,16, now mutually divergent, pass through an optical device in the form of an etalon 30, and onto photodetectors 40,42.

The intensity of light incident upon each of the photodetectors 40,42 is summed, and the summed output is used (after normalisation to take account of fluctuations in the instantaneous intensity of the output beam) to control the drive current for the laser diode 10, thereby to stabilise its frequency.

Figure 2A:
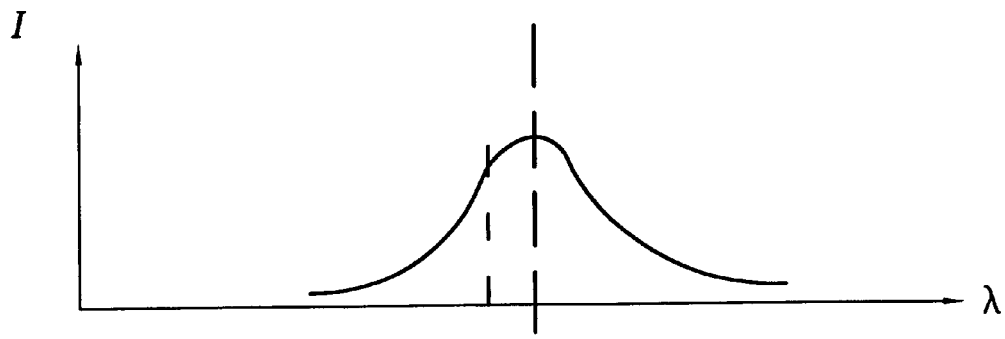
FIGS. 2a–c are graphs illustrating the various characteristics of the embodiment of FIG. 1.
Figure 2B:
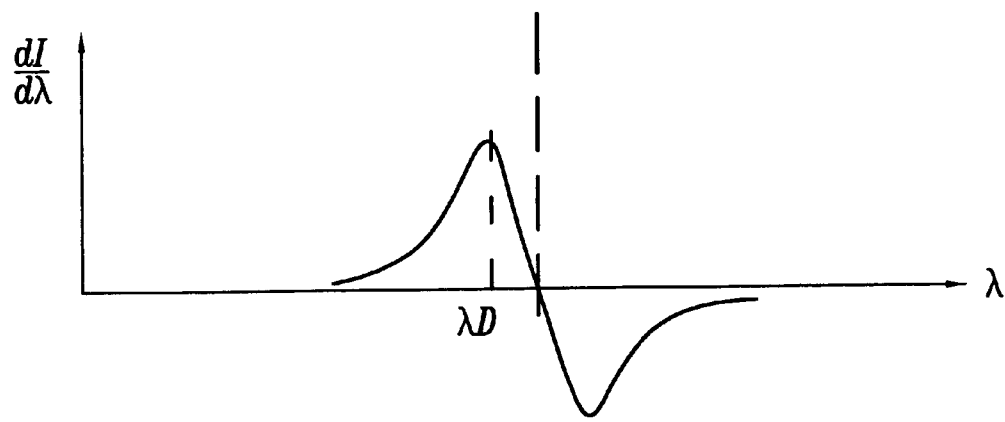
Figure 2C:
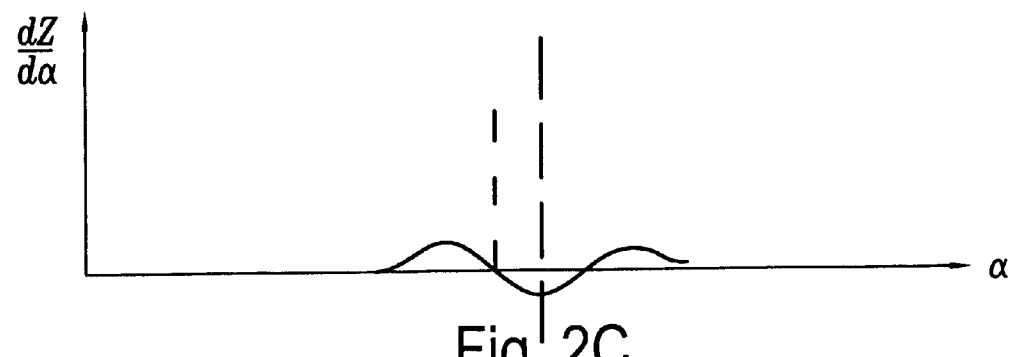

Referring now to FIG. 2A, the combined output of the photodetectors with variation in wavelength of the incoming beam is illustrated. FIG. 2B shows that the greatest sensitivity to change in wavelength in the incoming beam occurs at wavelength $\lambda D$; it is therefore advantageous to operate at this wavelength where the etalon and detector of the present invention are to be used to monitor wavelength. By contrast it can be seen from FIG. 2C that the variation in the sum of transmitted light intensity with varying angle is zero at this value. The apparatus therefore exhibits maximum sensitivity to variation in wavelength simultaneously with minimum sensitivity to variation in angle. This phenomenon manifests itself in the outputs of the photodetectors. A variation in angle will result in an increase in the output of one of the detectors, and a corresponding decrease in output of the other. By contrast, a variation in wavelength will cause simultaneous increases or decreases in the outputs of both detectors.

Figure 3:
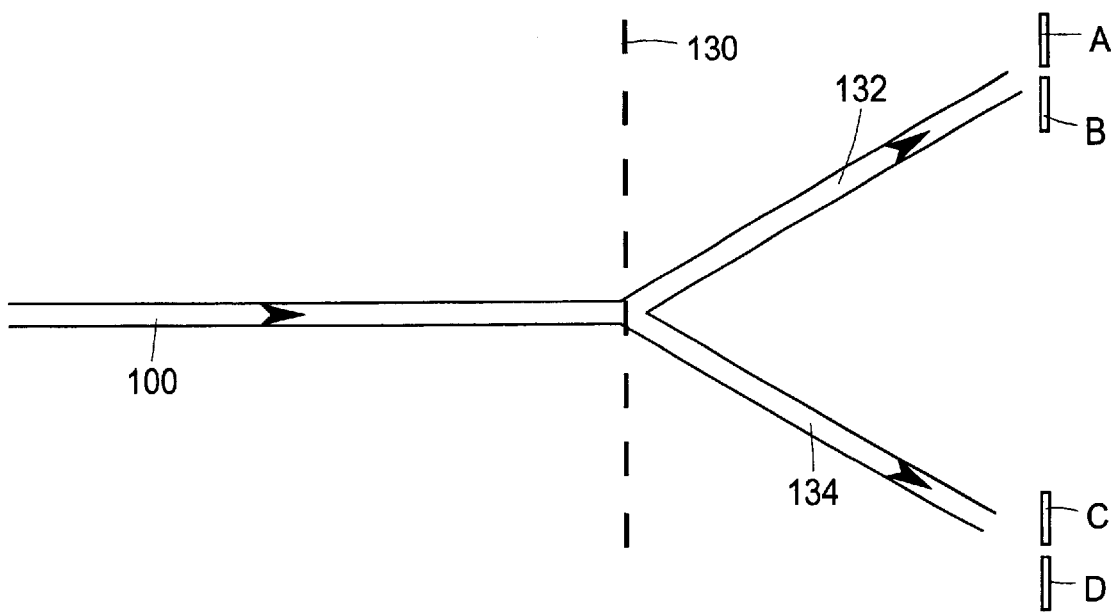
FIG. 3 is a schematic illustration of a second embodiment of the present invention.

Referring now to FIG. 3, in an alternative embodiment, the output beam 100 of the laser is incident upon an optical device in the form of a transmissive diffraction grating 130. Interaction of the beam 100 during passage through the grating 130 results in the generation of positive and negative first order diffracted beams 132, 134. The grating thus interacts with the beam 100 in a frequency sensitive manner, and generates a pair of non-parallel beams 132, 134 therefrom. The beams 132, 134 are incident respectively upon split photodetectors AB,CD (which are preferably reversed biased). A change in the frequency of the beam 100 will result in a change in the angle of diffraction of the beams 132, 134 as a result of their passage through the grating 130, and this change will affect each of the beams equally, but in opposing directions. Thus, in the event of a change of frequency, the beams will undergo a change in diffraction angle such that the angle between them increases or decreases, or put another way, they become more or less divergent depending upon the direction in which the frequency of the incoming beam shifts. By contrast, in the event of a change in orientation of the grating 130 with respect to the incoming beam 100, the beams 132, 134 will undergo a change in direction of angular deflection with respect to the incoming beam 100, but in this instance, the change will cause both of the beams to deflect in the same direction. The difference between these two events is made manifest in the different outputs from the split photodetectors AB,CD. In the two different cases:

(i) in the event of a change in frequency which results (for example) in an increase in the diffraction angle of the beams 132,134, more light will fall on photodetector portions A and D, and less will fall on photodetector portions B and C;

(ii) in the event of a change in orientation of the grating 130, the photodetector outputs will be altered such that the amount of light incident on photodetector portions B and D increases whereas the amount of light incident upon photodetector portions A and C decreases (for example).

It is thus possible to configure a processing system from these photodetector outputs such that changes in the outputs of the photodetectors AB,CD which represent a change in angle of the grating 130 with respect to the beam 100 are ignored, but changes which represent a change in the frequency of the incoming beam are converted to an error signal which is used to stabilise the frequency of the semi-conductor laser.

Figure 5:
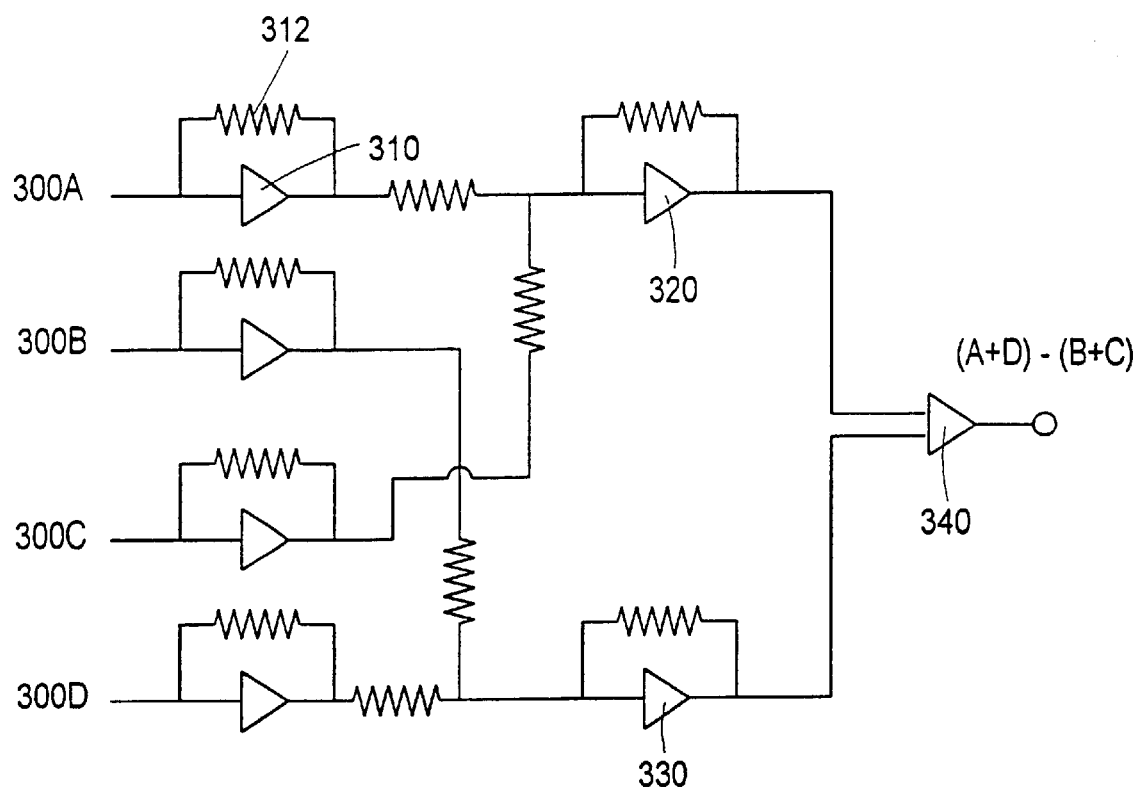
FIG. 5 is a schematic illustration of a processing circuit used with the embodiments of FIGS. 3 and 4.

Referring now to FIG. 5, such a circuit includes four input channels 300A,B,C,D, connected respectively to the corresponding elements of the photodetectors AB,CD. Each of the inputs 300 passes through an amplifier 310, connected in parallel with a resistor 312 in order to convert the current signal from the photodetectors to a voltage signal. The amplified inputs of channels 300A and 300D are summed at a further amplifier 320; similarly, the amplified inputs of channels 300B and 300C are summed at an amplifier 330. The outputs of the amplifiers 320,330 are sent to a differential amplifier 340 which thus generates an output (A+D)−(B+C), to provide a requisite error signal.

Figure 4:
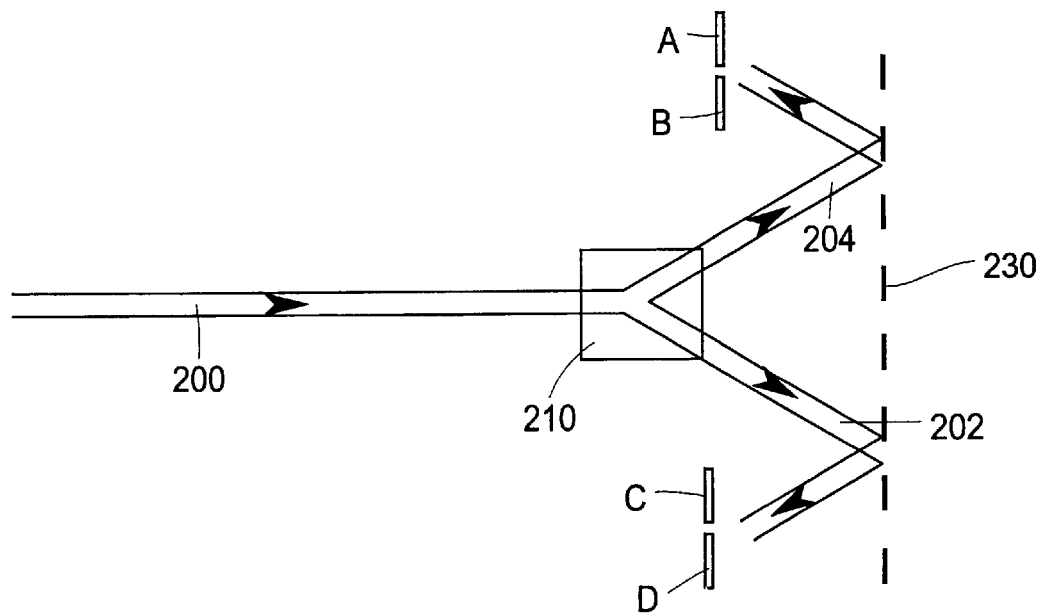
FIG. 4 is a schematic illustration of a third embodiment of the present invention.

A further embodiment is illustrated in FIG. 4, in which an incoming laser beam 200 is split into two beams 202,204 by means of a prism 210. The beams 202,204 are incident upon a reflective diffraction grating 230, and subsequently upon split photodetectors AB,CD respectively. The outputs from the photodetectors AB,CD are processed in the same way as those for the embodiment of FIG. 3 to produce the requisite error signal which is sensitive to changes in frequency of the light beam 200, but insensitive to changes in its angular orientation with respect to the grating 230.

What is claimed is:

1. Apparatus for stabilising the output frequency of a beam of laser light generated by a semi-conductor laser comprising: an optical device situated in the beam path and which interacts with the beam, wherein a parameter describing the interaction varies with (a) incident beam frequency, and (b) angle of incidence between beam and the device; means for producing from the beam at least two non-parallel beams each of which is incident upon at least one optical detector, the outputs of the detectors being processed to produce an error signal for controlling operation of the laser in order to stabilise its output frequency, the error signal being sensitive to changes in frequency, and insensitive to changes in angle of incidence between the laser beam and the device.

2. Apparatus according to claim 1 wherein the optical device and the means for producing non-parallel beams are distinct.

3. Apparatus according to claim 1 wherein the non-parallel beams are mutually divergent.

4. Apparatus according to claim 1 wherein each of the non-parallel beams are incident upon a pair of photodetectors.

5. Apparatus according to claim 1 wherein the optical device is an etalon.

6. Apparatus according to claim 5 wherein the means for generating non-parallel beams is a prism.

7. Apparatus according to claim 1 wherein the optical device is a diffraction grating.

8. Apparatus according to claim 7 wherein the diffraction grating is transmissive.

9. Apparatus according to claim 7 wherein the diffraction grating is reflective.

10. A method of stabilising the output frequency of a semi-conductor laser beam comprising the steps of:

directing the beam onto an optical device which interacts with the beam, a parameter describing the interaction being dependent upon the frequency of the beam;

generating at least a pair of non-parallel beams;

directing at least two of tile non-parallel beam onto a photodetector;

processing outputs from the photodetector to generate an error signal for stabilising the laser output frequency, the error signal varying in dependence upon the frequency of the laser beam, but being independent of the relative orientation of the beam and the device.

11. Apparatus for stabilising the output frequency of a beam of laser light generated by a semi-conductor laser comprising: a diffraction grating situated in the beam path and which interacts with the beam, wherein a parameter describing the interaction varies with (a) incident beam frequency, and (b) angle of incidence between beam and the grating; said beam being split into at least two non-parallel beams, each of which is incident upon at least one optical detector, the outputs of the detectors being processed to produce an error signal for controlling operation of the laser in order to stabilise its output frequency, the error signal being sensitive to changes in frequency, and insensitive to changes in angle of incidence between the laser beam and the grating.

12. Apparatus according to claim 11 wherein the diffraction grating is transmissive.

13. Apparatus according to claim 11 wherein the diffraction grating is reflective.

14. Apparatus according to claim 11 wherein the non-parallel beams are mutually divergent.

15. Apparatus according to claim 11 wherein each of the non-parallel beams are incident upon a pair of photodetectors.

16. Apparatus according to claim 11 wherein said diffraction grating splits the beam of laser light into at least two non-parallel beams.

17. Apparatus according to claim 11 wherein a beam splitting device separate from the diffraction grating splits the beam of laser light into at least two non-parallel beams.

18. Apparatus for stabilising the output frequency of a beam of laser light generated by a semi-conductor laser comprising: an optical device situated in the beam path and which interacts with the beam, wherein a parameter describing the interaction varies with (a) incident beam frequency, and (b) angle of incidence between beam and said optical device; a beam splitting device for producing from the beam at least two non-parallel beams each of which is incident upon at least one optical detector, the outputs of the detectors being processed to produce an error signal for controlling operation of the laser in order to stabilise its output frequency, the error signal being sensitive to changes in frequency, and insensitive to changes in angle of incidence between the laser beam and said optical device.

19. Apparatus according to claim 18 wherein said optical device and the beam splitting device are distinct.

20. Apparatus according to claim 18 wherein the beam splitting device comprises a periscope.

21. Apparatus according to claim 18 wherein the non-parallel beams are mutually divergent.

22. Apparatus according to claim 18 wherein each of the non-parallel beams are incident upon a pair of photodetectors.

23. Apparatus according to claim 18 wherein the optical device is an etalon.

24. Apparatus according to claim 23 wherein the beam splitting device is a prism.

25. Apparatus according to claim 18 wherein the optical device is a diffraction grating.

26. Apparatus according to claim 25 wherein the diffraction grating is transmissive.

27. Apparatus according to claim 25 wherein the diffraction grating is reflective.

* * * * *